(12) United States Patent
Cahill et al.

(10) Patent No.: US 7,302,753 B2
(45) Date of Patent: Dec. 4, 2007

(54) ELECTRICAL GRIPPING TESTING AND INSTALLATION DEVICE

(76) Inventors: Bryan Cahill, 133 W. Honolulu, Ste. C, Lindsay, CA (US) 93247; Deborah Unser, 133 W. Honolulu, Ste. C, Lindsay, CA (US) 93247

( * ) Notice: Subject to any disclaimer, the term of this patent is extended or adjusted under 35 U.S.C. 154(b) by 93 days.

(21) Appl. No.: 10/961,358

(22) Filed: Oct. 7, 2004

(65) Prior Publication Data

US 2005/0056451 A1 Mar. 17, 2005

Related U.S. Application Data

(63) Continuation of application No. 10/171,014, filed on Jun. 12, 2002, now Pat. No. 7,032,297.

(51) Int. Cl.
*P23P 21/00* (2006.01)
*B23Q 15/00* (2006.01)

(52) U.S. Cl. .................. 29/721; 29/278; 29/281.1; 29/566; 29/750; 29/759; 7/107

(58) Field of Classification Search .......... 29/33 M, 29/270, 278, 280–281.4, 559, 565–566.4, 29/719, 721, 729, 739, 744, 748, 750, 752, 29/756–760, 720; 7/107, 133, 104, 164; 81/884, 94; D10/78, 64; D13/138.1, 138.2; 174/66, 67; 324/508, 556; 30/90.1, 91.2
See application file for complete search history.

(56) References Cited

U.S. PATENT DOCUMENTS 1,714,763 A   5/1929   Boyson
D155,149 S    9/1949   Gossard
D155,150 S    9/1949   Gossard
2,748,359 A   5/1956   Swan
D182,942 S    5/1958   Wrubel
3,114,277 A * 12/1963  Clendenin ............... 30/90.1
3,579,826 A * 5/1971   Morain .................... 30/93
D242,464 S    11/1976  Acosta
4,034,284 A   7/1977   Peplow
4,164,702 A   8/1979   Pereda
4,290,591 A   9/1981   Smith
4,589,211 A * 5/1986   Policka ................... D10/64
4,888,879 A   12/1989  Dixon
4,953,293 A * 9/1990   Sterlacci .................. 7/107
5,168,235 A   12/1992  Bonner
5,205,006 A * 4/1993   Panasuk .................. 7/108
5,265,338 A * 11/1993  Cheng .................... 30/90.1

(Continued)

OTHER PUBLICATIONS

Sales brochure, Oct. 2000.

*Primary Examiner*—Peter Vo
*Assistant Examiner*—Donghai D. Nguyen
(74) *Attorney, Agent, or Firm*—Mark D. Miller

(57) ABSTRACT

A method and apparatus for the safe and easy installation of wall-mounted electrical outlets and switches utilizing a multi-functional tool. Two different but similar tools are provided, each in the form of an insulated handle that may be detachably engaged with either a wall socket or a wall switch. The wall socket device includes one or more prongs for temporary engagement with slots in the socket fixture, and may include testing circuitry. The wall switch device is temporarily attached to a switch fixture using one or more magnets. Both tools may also include built-in electrical wire measuring, stripping and bending structures.

16 Claims, 4 Drawing Sheets

U.S. PATENT DOCUMENTS

| | | |
|---|---|---|
| 5,285,163 A | 2/1994 | Liotta |
| D357,459 S | 4/1995 | Warden |
| 5,409,397 A | 4/1995 | Karman |
| 5,516,305 A | 5/1996 | Haluska |
| 5,642,052 A * | 6/1997 | Earle ........................ 324/556 |
| D405,222 S | 2/1999 | Gilbert, Jr. et al. |
| 6,218,844 B1 | 4/2001 | Wong et al. |

* cited by examiner

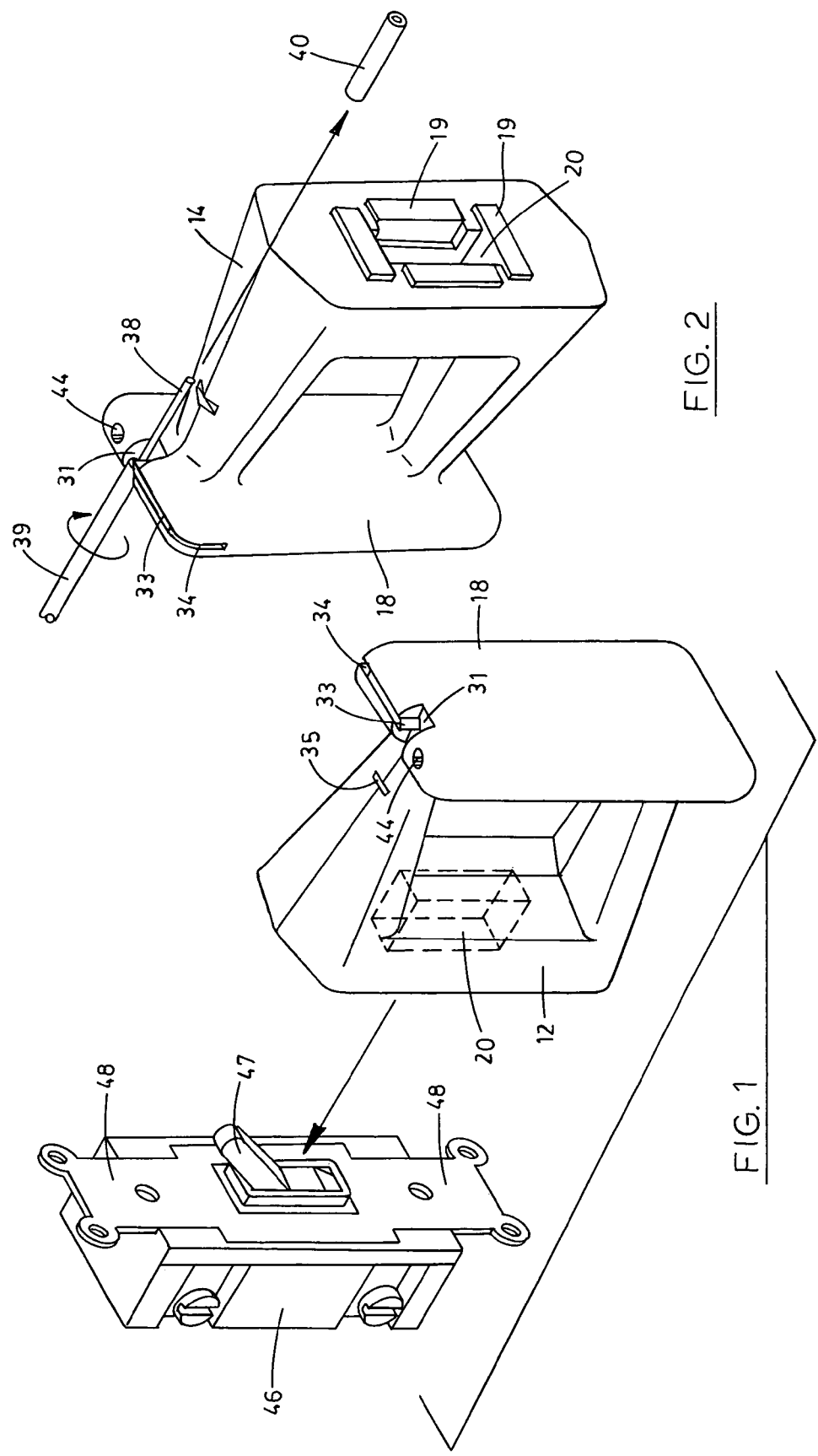

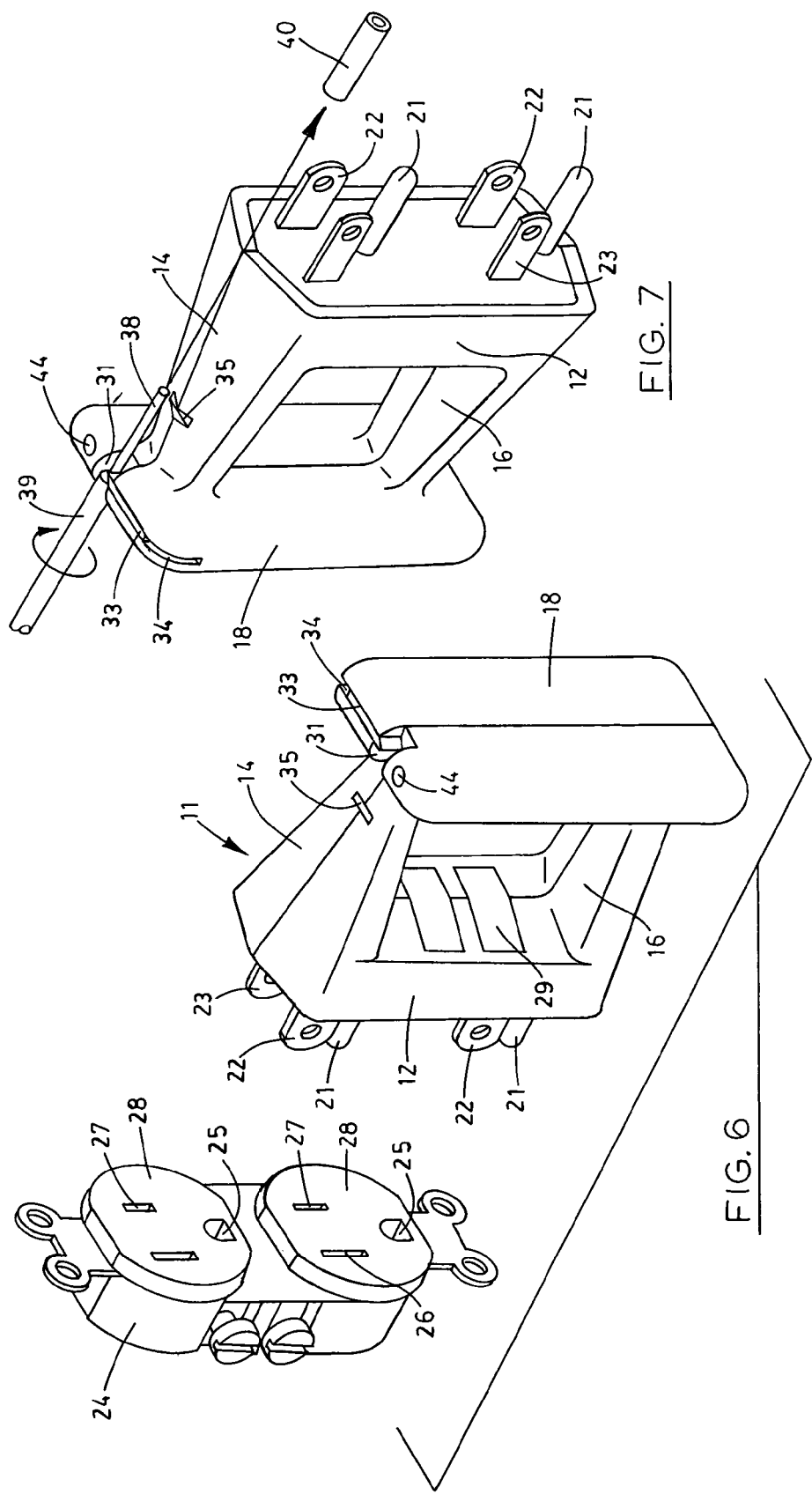

ELECTRICAL GRIPPING TESTING AND INSTALLATION DEVICE

This application is a continuation of application Ser. No. 10/171,014 filed on Jun. 12, 2002 now U.S. Pat No. 7,032,297, which (see below) claims the benefits of applications No. 29/160,095 filed on May 3, 2002, and No. 29/146,415 filed on Aug. 9, 2001.

BACKGROUND OF THE INVENTION

1. Field of the Invention

The present invention relates to installation and repair of electrical outlets in buildings, and more particularly to a method and apparatus for holding, testing and installing wall-mounted electrical outlets and switches.

2. Description of the Prior Art

Wall-mounted electrical outlets and switches are installed every day during new construction, remodeling and repair of homes, offices, warehouses, residential and commercial structures, and other buildings. A typical wall switch or outlet is installed in a junction box that is attached to the frame that supports the wall. Wires are installed that run from an electrical power source such as a circuit breaker or fuse box, through the frame to the junction box that will hold the outlet or switch. Eventually, a point is reached during construction where power is available to be supplied through the wires that run to the electrical outlet and switch boxes. Once power is available, the electrical outlet fixtures and switches may be installed in the junction boxes and tested to confirm that they are working properly.

Wall Socket. Installing an electrical outlet or wall socket generally requires connecting the hot (black), neutral (white) and ground (green/bare) wires to the outlet fixture itself, testing the fixture to confirm that the connections are correct and that it is receiving power, attaching the fixture to the junction box, and eventually attaching a cover plate over the fixture. The most common fixtures include at least one pair of screws or terminals to which the hot and neutral wires are attached. Other fixtures include at least one pair of locking terminal openings into which the stripped, straight hot and neutral wires may be inserted. These openings may be provided instead of or in addition to screws. Wires that are inserted into these terminal openings cannot be easily removed unless an adjacent locking tab is depressed to release them. Virtually all outlet fixtures include a metallic mounting portion for attaching the fixture to the junction box. A separate green-colored grounding terminal is generally provided in the form of a screw on the metallic portion, allowing for attachment of the ground wire to ground the fixture to the junction box.

An electrician ordinarily uses a wire stripper and/or crimping tool to strip and, if necessary, bend the wires prior to attachment to the outlet fixture. A screwdriver is also required to tighten the wire screws, to attach the fixture to the box, and to install the cover plate over the fixture. The fixture must be handled carefully once the hot and neutral wires have been attached in order to avoid an electric shock. This often requires the use of a separate pair of pliers having insulated handles. The electrician then uses one hand to hold the fixture against the junction box with the pliers, while using the other hand to attach the fixture to the box using a screwdriver. This can be cumbersome because of the bulky configuration of the fixture, particularly in those cases where the pliers and screwdriver are using the same region on the fixture. For easier handling, in order to save time and to avoid the use (and possible misplacement) of an extra tool, many installers forego the use of any tool to hold the connected fixture, and instead run the risks associated with handling a "hot" socket fixture without insulation. This, of course, is dangerous and should be avoided if at all possible.

Wall socket testing devices have been developed in the prior art, such as those disclosed in U.S. Pat. Nos. 4,034,284; 4,164,702 and 6,218,844 having prongs for insertion into the slots of the wall socket to determine whether the hot and neutral wires have been connected correctly. U.S. Pat. No. 5,168,235 discloses a tool for testing and manipulating electrical outlets. All of these devices are bulky, and none of them include any handle for simple, efficient removal of the device from the socket. Moreover, no known device provides the stripping and wire bending function in the same tool used for manipulation and testing of the wall socket.

It is therefore desirable to provide a single tool for use in installing a wall socket that may be detachably engaged with the socket, that has a convenient insulated handle for easy manipulation of the socket without any danger of electrical shock, and that also includes a means for measuring and stripping the ends of the wires, a means for bending the ends of the wires, and a means for testing the socket after the wires have been attached.

Wall Switch. Installing an electrical wall switch also requires connecting the hot, neutral and ground wires to the switch fixture itself, testing the fixture, attaching it to the junction box, and eventually attaching a cover plate. As with wall sockets, most switch fixtures include a pair of screws or terminals to which the hot and neutral wires are to be attached. Newer fixtures may include a pair of locking terminal openings into which the stripped, straight hot and neutral wires may be inserted; instead of or in addition to the screw terminals. And virtually all wall switches also include a metallic mounting portion for attaching the fixture to the junction box. A separate green-colored grounding terminal is provided in the form of a screw on this metallic portion for attachment of the ground wire to ground the fixture to the junction box.

As with wall sockets, the electrical wires must be stripped, and in some cases bent prior to attachment to the switch fixture. Then the fixture must be handled carefully in order to avoid an electric shock. An electrician faces installation problems similar to those of a wall socket, in that one hand is used to hold the fixture against the junction box with a pair of pliers, while the other hand is used to attach the fixture to the box using a screwdriver. Should the installer forego the use of an insulated tool to hold the connected fixture, (s)he faces the risks associated with handling a "hot" socket fixture without insulation.

Since there are no slots on ordinary wall switch fixtures, the testing and manipulation devices that have been developed in the prior art for wall sockets cannot be used with wall switches. No known devices exist that allow a user to detachably engage a wall switch for manipulation and insulation prior to and during installation. Nor are any devices known to exist which provide the added functions of stripping and if necessary bending the wires prior to attachment to the switch.

It is therefore desirable to provide a single tool for use in installing a wall switch that may be detachably engaged with the switch, that has a convenient insulated handle for easy manipulation of the switch without any danger of electrical shock, and that also optionally includes a means for measuring and stripping the ends of the wires, and a means for bending the ends of the wires.

SUMMARY OF THE INVENTION

The present invention provides a method and apparatus for the safe and easy installation of wall-mounted electrical outlets and switches utilizing a multi-functional tool. Two different but similar tools are provided, one for use in connection with the installation and testing of wall sockets, and the other for use in connection with the installation of wall switches. Both tools are in the form of insulated handles that may be detachably engaged with either a wall socket or a wall switch, and both tools may include built-in wire measuring, stripping and bending devices.

In the wall socket aspect of the apparatus, one or more prongs are provided which correspond with at least one of the hot, ground and/or neutral slots of the wall socket fixture to be installed. These prong(s) are integrated into a convenient insulated handle having a large central opening that allows the user to firmly grip the handle for attachment and removal of the apparatus from the socket fixture. Attaching the apparatus to the socket fixture allows the fixture to be easily manipulated using the handle without fear of electrical shock. The handle is sized such that the mounting slots and screws at both ends of the socket are easily accessible for attachment to the mounting tabs on the junction box.

In one embodiment of the wall socket manipulation handle, a recessed slot is provided in the top of the handle, and a blade is provided which partially protrudes into the slot. Measurement indicia are provided on the side of the handle below the slot. The bladed slot is used for stripping the wires to be attached to the fixture, and the measurement indicia are used for establishing the gauge or length of the wire to be stripped. By using the measurement indicia to select the position for the wire in the slot, the wire may be inserted into the slot and rotated against the blade to strip off the correct amount of insulation from the wire so that it may be attached to the fixture. A pre-measured hole is also provided in the handle of this embodiment into which the stripped wire may be easily inserted so that it may be bent over in order to fit over the screw terminals of the fixture.

In another embodiment of the wall socket manipulation handle, testing lights or other means are provided in the handle to confirm that the socket has been properly connected to the electrical wiring.

In the wall switch aspect of the apparatus, one or more magnets are provided on the convenient insulated handle for temporary attachment to the metallic portions of the switch during installation. The magnet(s) surround an opening that receives the toggle portion of the wall switch when attached to the handle. The magnet(s) and toggle switch opening are integrated into a convenient handle having a large central opening that allows the user to firmly grip the handle for attachment and removal of the apparatus from the switch. Attaching the apparatus to the switch allows it to be easily manipulated using the handle without fear of electrical shock. The handle is sized such that the mounting slots and screws at both ends of the switch are easily accessible for attachment to the mounting tabs on the junction box.

In one embodiment of the wall switch manipulation handle, a recessed slot is provided in the top of the handle, and a blade is provided which partially protrudes into the slot. Measurement indicia are provided on the side of the handle below the slot. The bladed slot is used for stripping the wires to be attached to the fixture, and the measurement indicia are used for establishing the gauge or length of the wire to be stripped. By using the measurement indicia to select the position for the wire in the slot, the wire may be inserted into the slot and rotated against the blade to strip off the correct amount of insulation from the wire so that it may be attached to the fixture. A pre-measured hole is also provided in the handle of this embodiment into which the stripped wire may be easily inserted so that it may be bent over in order to fit over the screw terminals of the fixture.

It is therefore a primary object of the present invention to provide a tool in the form of a convenient insulated handle for temporary attachment to a wall switch or socket fixture for use in manipulating said fixture during installation of the fixture to a junction box.

It is also a primary object of the present invention to provide a single tool that may be temporarily attached to a wall switch or socket fixture to facilitate easy installation of the fixture, the tool having a built-in blade and measuring indicia for use in stripping the wires to be attached to the fixture.

It is another object of the present invention to provide a tool in the form of an insulated handle having at least one prong thereon for insertion into at least one slot of a wall socket fixture allowing for temporary attachment of the handle to the fixture during installation of the fixture to a junction box.

It is another object of the present invention to provide a tool in the form of an insulated handle for temporary attachment to a wall socket fixture during installation of the fixture, the tool having a built-in blade and measuring indicia for use in stripping the wires to be attached to the fixture.

It is another object of the present invention to provide a tool in the form of an insulated handle for temporary attachment to a wall socket fixture during installation of the fixture, the tool having an opening for receiving a stripped wire that may be used to easily bend the wire for proper attachment to the fixture.

It is another object of the present invention to provide a tool in the form of an insulated handle for temporary attachment to a wall socket fixture during installation of the fixture, the tool having circuitry and at least one indicator thereon for use in determining whether the fixture has been properly attached to the wires.

It is another object of the present invention to provide a tool in the form of an insulated handle having an opening for receiving the toggle lever of a wall switch fixture and at least one magnet for temporary attachment to the metallic portion of the wall switch fixture during installation of the fixture to a junction box.

It is another object of the present invention to provide a tool in the form of an insulated handle for temporary attachment to a wall switch fixture during installation of the fixture, the tool having a built-in blade and measuring indicia for use in stripping the wires to be attached to the fixture.

It is another object of the present invention to provide a tool in the form of an insulated handle for temporary attachment to a wall switch fixture during installation of the fixture, the tool having an opening for receiving a stripped wire that may be used to easily bend the wire for proper attachment to the fixture.

Additional objects of the invention will be apparent from the detailed descriptions and the claims herein.

BRIEF DESCRIPTION OF THE DRAWINGS

FIG. 1 is a perspective view of an embodiment of the present invention showing the alignment for attachment to an electrical toggle wall switch.

FIG. 2 is an opposite side perspective view of the embodiment of FIG. 1.

FIG. 6 is a perspective view of another embodiment of the present invention showing the alignment for attachment to an electrical wall socket.

FIG. 7 is an opposite side perspective view of the embodiment of FIG. 6.

DETAILED DESCRIPTION OF A PREFERRED EMBODIMENT

Figure 5:
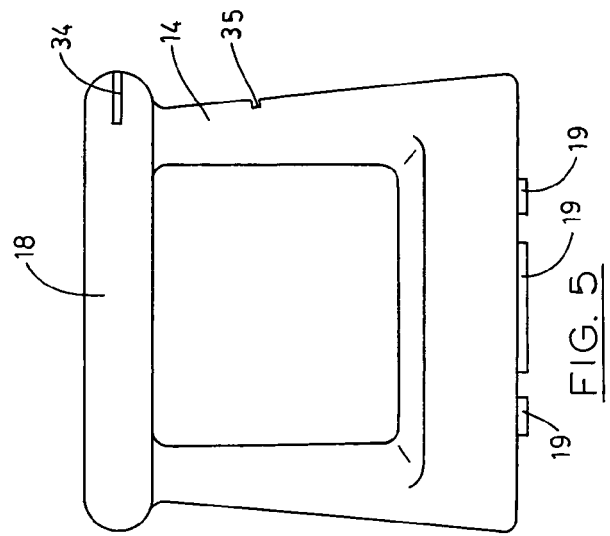
FIG. 5 is a side elevational view of the embodiment of FIGS. 1-4.
Figure 4:
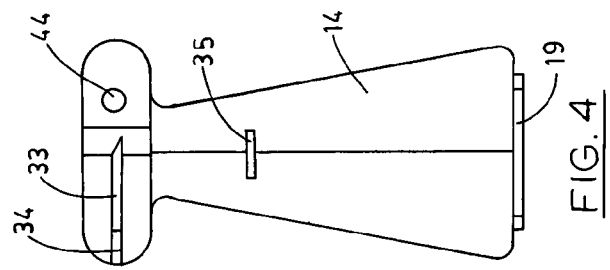
FIG. 4 is an end view of the embodiment of FIGS. 1-3.

The insulated manipulation handle of the present invention will be described herein with reference to the mounting and installation of conventional wall sockets and switches as illustrated. However, it is to be understood that embodiments of the present invention may be used for installation of many different kinds of wall sockets and/or switches having different slot configurations, different numbers and shapes of toggle levers, etc.

Referring to the drawings wherein like reference characters designate like or corresponding parts throughout the several views, and referring particularly to FIGS. 6-10 it is seen that the embodiment of the present invention suitable for installation of wall socket fixtures includes an insulated integral handle portion, generally 11, made up of a base 12 having proximal and distal support arms 14 and 16 connected between the base 12 and a hand grip 18. Support arms 14 and 16 are located at opposite ends of base 12 and grip 18 defining a wide opening in the center of the handle 11. This opening provides a space for the user's fingers when holding the handle. Grip 18 is illustrated in the form of a tabletop, but may have any shape that is suitable for gripping by hand.

In the embodiment designed for manipulation of a wall socket fixture, one or more prong(s) 21 are provided on the outside edge of base 12 for snug insertion into one or more of the slot(s) 25 of the socket fixture 24. In the illustrated embodiment, two complete sets of three prongs are shown, corresponding to both of the sockets of the fixture. However, for manipulation purposes, any number and/or combination of prongs may be used, ranging from a single prong for a single socket to a complete set of prongs for all sockets.

In another embodiment, a complete set of prongs 21-23 are provided for each socket 28 for testing purposes, the prongs 21-23 of each set corresponding to the slots 25-27 of each socket 28 of the fixture 24. Circuitry (not illustrated) inside the handle connects the prongs 22 and 23 of each set to an indicator signal such as window 29 that illuminates upon insertion of the prongs into the slots, if the fixture 24 has been properly connected to the power source. Alternatively, a sound activated signal may be provided. Additional circuitry and indicator signals (not illustrated) may be provided to confirm more specific information such as the proper attachment of hot, neutral and ground wires for each socket.

It is to be understood that different numbers, sizes and arrangements of prongs may be provided on handle 11 corresponding to different socket slot configurations, including without limitation and for illustrative purposes only, 220 volt fixtures, European fixtures, various A/C and D/C fixtures, and the like.

In one embodiment, a wire stripper is provided in grip 18. The wire stripper is in the form of a slot 31 located at a peripheral edge of the grip 18. A removable and replaceable blade 33 is provided in another thinner slot 34 on the same peripheral edge of grip 18 such that the sharp edge of blade 33 protrudes part way into slot 31. No portion of blade 33 extends beyond the peripheral profile of grip 18, thereby minimizing the possible infliction of cuts to the user during handling. Measuring indicia such as cut 35 are provided on the support arm (14, in the illustration) adjacent to slot 31 for use in determining the length of the portion of the wire to be stripped. While a single cut 35 is illustrated, it is to be understood that any suitable measuring indicia may be provided including without limitation a series of spaced cuts, printed measurements in either metric or English, or other indicia. The size of slot 31 and the position of blade 33 therein may vary according to the gauge of wire expected to be used with the invention.

Figure 8:
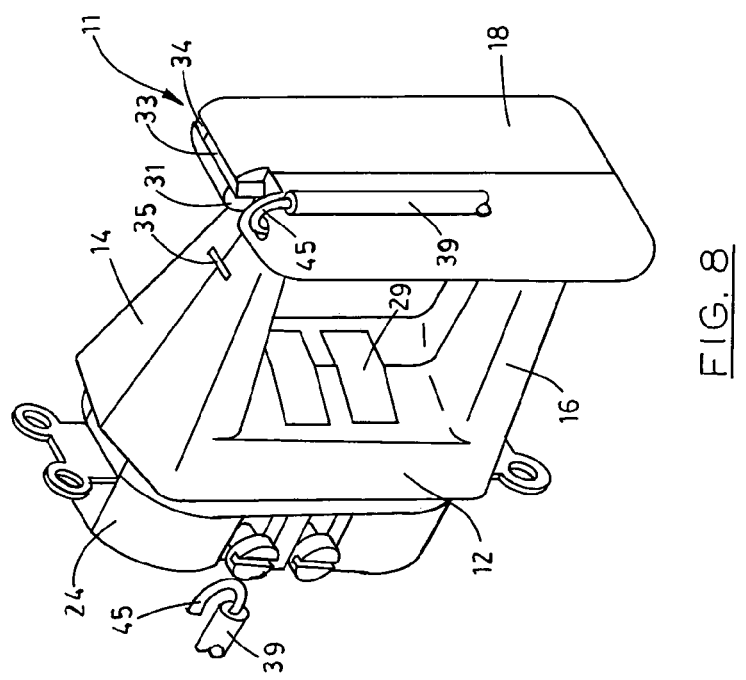
FIG. 8 is a perspective view of the embodiment of FIG. 6 frictionally attached to an electrical wall socket.

Using the measuring indicia 35, a wire having an inner metallic core 38 and an outer insulated sleeve 39 is inserted into slot 31 such that blade 33 pierces the insulated sleeve 39 as shown in FIG. 7. Then, either the invention 11 is rotated around the wire, or the wire rotated inside slot 31, resulting in the blade 33 stripping of a portion of the insulation 40 from the wire. A hole 44 may also be provided on grip 18 for bending the stripped portion 38 of the wire for attachment to the screws of the fixture. Hole 44 is sized such that the width of the hole 44 is the same as the gauge of the wire to be used. The depth of hole 44 is set such that the stripped portion of the wire may be fully inserted into the hole and bent over as shown in FIG. 8 to form an arc 45 that is easily attached around a screw on the fixture.

In use, the prongs 21-23 of the insulated handle 11 are temporarily inserted into the slots 25-27 of a wall socket fixture 24. The fixture 24 may then be manipulated into any convenient position using the handle 11. Wires may be stripped and bent using the stripping slot and bending hole in the grip of the handle. These wires may then be attached to the fixture while it is still engaged with the handle, and the indicator signals used to confirm proper attachment. Finally, the fixture may be held in place using the handle while the fixture is installed into the junction box. Following such installation, the handle is detached from the fixture. Thus, the unique handle 11 of the present invention greatly simplifies the stripping and attachment of wires to a wall socket fixture as well as the installation of the fixture into a junction box, while avoiding unnecessary exposure to electric shock.

Referring to the embodiment of FIGS. 1-5 of the drawings, it is seen that the embodiment of the present invention suitable for installation of wall switch fixtures also includes insulated integral handle portion, generally 11, made up of a base 12 having proximal and distal support arms 14 and 16 connected between the base 12 and a hand grip 18. Support arms 14 and 16 are located at opposite ends of base 12 and grip 18 defining a wide opening in the center of the handle 11. This opening provides a space for the user's fingers when holding the handle. Grip 18 is illustrated in the form of a tabletop, but may have any shape that is suitable for gripping by hand.

In the embodiment designed for manipulation of a wall switch fixture, one or more magnets 19 are provided are provided on the outside edge of base 12 for temporary but firm attachment to the metallic portions 48 of the wall switch fixture 46. A large slot 20 is provided on the outside edge of base 12 for receiving the toggle lever 47 of the switch. Slot 20 is surrounded by magnets 19. It is to be appreciated that while the embodiment illustrated in FIG. 2 shows four magnets, a single magnet 19 is sufficient to accomplish the temporary attachment required by the invention, and that such single magnet 19 may be provided at either end or on either side of slot 20. Alternatively, any number of magnets 19 may be employed near or around slot 20, or a single magnet in the form of a frame that surrounds opening 20 may be used.

In one embodiment, a wire stripper is provided in grip 18. The wire stripper is in the form of a slot 31 located at a peripheral edge of the grip 18. A removable and replaceable blade 33 is provided in another thinner slot 34 on the same peripheral edge of grip 18 such that the sharp edge of blade 33 protrudes part way into slot 31. No portion of blade 33 extends beyond the peripheral profile of grip 18, thereby minimizing the possible infliction of cuts to the user during handling. Measuring indicia such as cut 35 are provided on the support arm (14, in the illustration) adjacent to slot 31 for use in determining the length of the portion of the wire to be stripped. While a single cut 35 is illustrated, it is to be understood that any suitable measuring indicia may be provided including without limitation a series of spaced cuts, printed measurements in either metric or English, or other indicia. The size of slot 31 and the position of blade 33 therein may vary according to the gauge of wire expected to be used with the invention.

Figure 3:
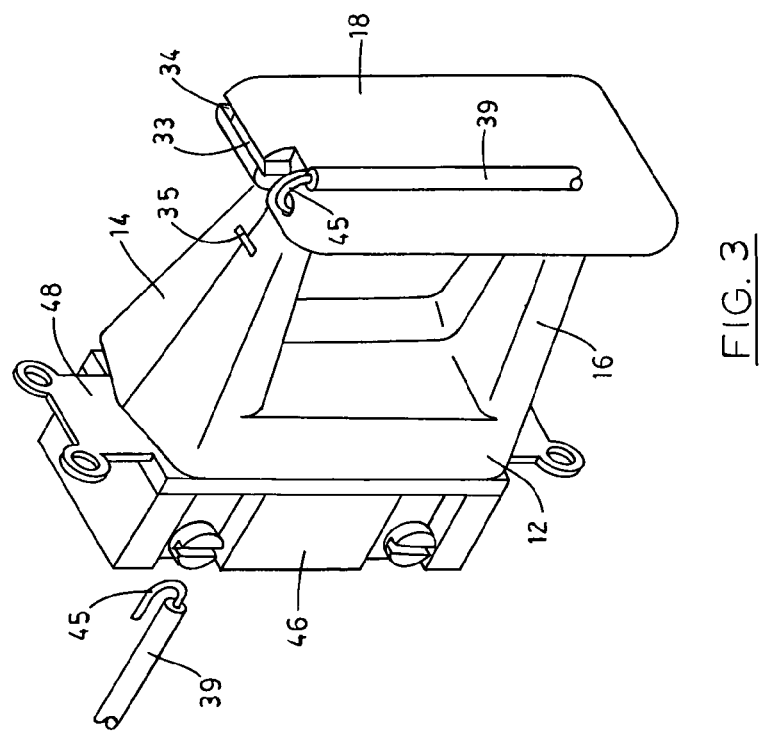
FIG. 3 is a perspective view of the embodiment of FIG. 1 magnetically attached to an electrical toggle wall switch.
Figure 10:
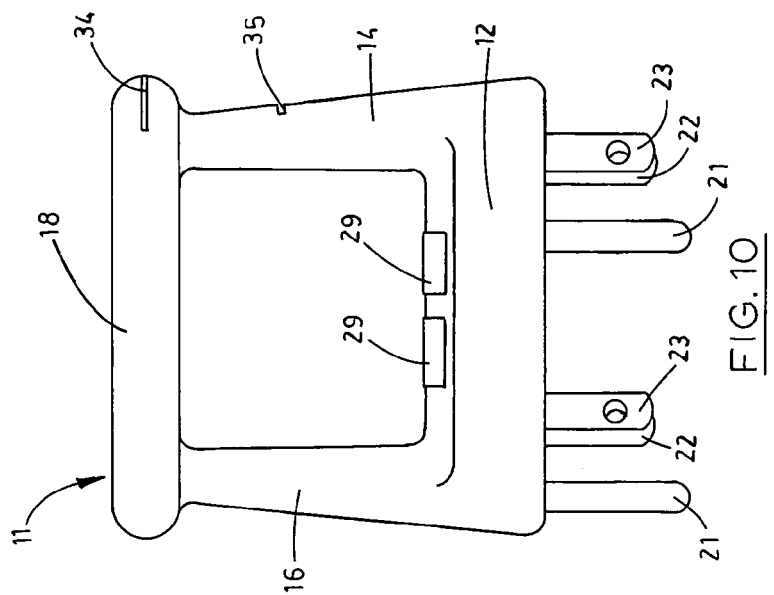
FIG. 10 is a side elevational view of the embodiment of FIGS. 6-9.
Figure 9:
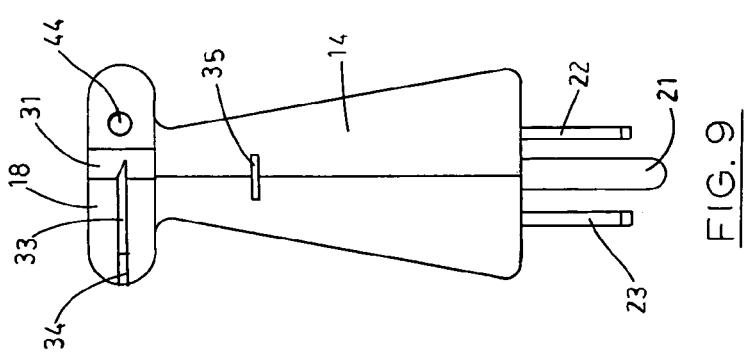
FIG. 9 is an end view of the embodiment of FIGS. 6-8.

Using the measuring indicia 35, a wire having an inner metallic core 38 and an outer insulated sleeve 39 is inserted into slot 31 such that blade 33 pierces the insulated sleeve 39 as shown in FIG. 2. Then, either the invention 11 is rotated around the wire, or the wire rotated inside slot 31, resulting in the blade 33 stripping of a portion of the insulation 40 from the wire. A hole 44 may also be provided on grip 18 for bending the stripped portion 38 of the wire for attachment to the screws of the fixture. Hole 44 is sized such that the width of the hole 44 is the same as the gauge of the wire to be used. The depth of hole 44 is set such that the stripped portion of the wire may be fully inserted into the hole and bent over as shown in FIG. 3 to form an arc 45 that is easily attached around a screw on the fixture.

In use, the magnets 19 of the insulated handle 11 are temporarily attached to the metallic portion 48 of the wall switch fixture 46. The fixture 46 may then be manipulated into any convenient position using the handle 11. Wires may be stripped and bent using the stripping slot and bending hole in the grip of the handle. These wires may then be attached to the fixture while it is still engaged with the handle. Finally, the fixture may be held in place using the handle while the fixture is installed into the junction box. Following such installation, the handle is detached from the fixture. Thus, the unique handle 11 of the present invention greatly simplifies the stripping and attachment of wires to a wall switch fixture as well as the installation of the fixture into a junction box, while avoiding unnecessary exposure to electric shock.

It is to be understood that variations and modifications of the present invention may be made without departing from the scope thereof. It is also to be understood that the present invention is not to be limited by the specific embodiments disclosed herein, but only in accordance with the appended claims when read in light of the foregoing specification.

What is claimed is:

1. An apparatus for manipulating an electrical wall socket fixture comprising an insulated handle having two sets of conductive prongs thereon for temporary engagement with a pair of sockets of said fixture, a pair of indicators on said handle, and wiring inside said handle connecting each set of prongs to one of said indicators such that each said indicator is triggered by the proper completion of a circuit through one of said sets of prongs and wherein a hole is provided on said handle that is to be bent and the handle includes an integrated electrical wire stripper available and sized to accommodate receipt of an electrical wire.

2. The apparatus of claim 1 wherein at least one prong, wire and indicator is provided for hot, neutral and ground slots of each socket such that each of said indicators is triggered, respectively, by completion of a circuit through said hot, neutral and ground slots of the respective socket.

3. The apparatus of claim 2 wherein each indicator is selected from the group consisting of a lighted signal, an audio signal, a liquid crystal display, a meter, and combinations thereof.

4. The apparatus of claim 1 wherein said handle includes wire measurement indicia.

5. The apparatus of claim 1 wherein said integrated electrical wire stripper comprising a slot provided at an edge of said handle, said slot having a floor and two opposing sides, and a blade having a sharp edge that partially protrudes into said slot from one of said sides.

6. An apparatus for manipulating an electrical wall socket fixture comprising an insulated handle having a plurality of conductive prongs thereon for temporary engagement with at least one socket of said fixture, an indicator on said handle, and wiring inside said handle connecting said prongs to said indicator such that said indicator is triggered by the completion of a circuit through said prongs wherein a wire stripping slot is provided at an edge of said handle, said slot having a floor and two opposing sides, and a blade is provided adjacent to said slot such that a sharp edge of said blade partially protrudes into said slot from one of said sides.

7. The apparatus of claim 6 wherein said blade is provided in a second slot adjacent to said wire stripping slot such that a sharp edge of said blade protrudes an adjustable distance into said wire stripping slot from one of said sides.

8. The apparatus of claim 6 wherein measuring indicia are provided on said handle for use in determining the length of a wire to be stripped.

9. The apparatus of claim 6 wherein a hole is provided on said handle for bending a wire.

10. The apparatus of claim 6 wherein said blade is replaceable.

11. An apparatus for manipulating an electrical wall socket fixture comprising a base having a complete set of conductive prongs for at least one socket of said fixture for temporary engagement with said socket fixture, an indicator provided on said base, and wiring provided inside said base connecting said prongs to said indicator such that said indicator is triggered by the proper completion of a circuit through said prongs, wherein separate wiring, circuitry and indicators are provided for the hot, neutral and ground slots of said fixture socket such that each of said indicators is triggered, respectively, by proper completion of a circuit through said hot, neutral and ground slots of said fixture socket, wherein said indicator is selected from the group consisting of a lighted signal, an audio signal, a liquid crystal display, and a meter, wherein said base includes a built-in electrical wire measuring structure, a built-in electrical wire bending structure, a wire stripping slot at an edge of said base, said slot having a floor and two opposing sides, and a blade adjacent to said slot such that a sharp edge of said blade partially protrudes into said slot from one of said sides for engagement with an insulated sleeve of a wire to be stripped wherein a hole is provided on said base for bending the stripped portion of said wire for attachment to a screw of said fixture.

12. An apparatus for manipulating an electrical wall socket fixture comprising an insulated handle having a plurality of conductive prongs thereon for temporary engagement with hot, neutral and ground slots of at least one socket of said fixture, a plurality of indicators on said handle, and wiring inside said handle connecting each of said prongs to an indicator such that each of said indicators is triggered, respectively, by proper completion of a circuit through said hot, neutral and ground slots of said socket; wherein said each of said indicators is selected from the group consisting of a lighted signal, an audio signal, a liquid crystal display, a meter, and combinations thereof; wherein a wire stripping slot is provided at an edge of said handle, said slot having a floor and two opposing sides, and a blade is provided adjacent to said slot such that a sharp edge of said blade partially protrudes into said slot from one of said sides for engagement with an insulated sleeve of a wire to be stripped; wherein measuring indicia are provided on one of said support arms for use in determining a length of wire to be stripped; and wherein a hole is provided on said handle for bending a wire for attachment to said fixture.

13. An apparatus for manipulating an electrical wall socket fixture comprising an insulated handle having a plurality of conductive prongs thereon for temporary engagement with at least one socket of said fixture, an indicator on said handle, and wiring inside said handle connecting said prongs to said indicator such that said indicator is triggered by completion of a circuit through said prongs, wherein a wire stripping slot is provided on said handle, said slot having a floor and two opposing sides, and blade is provided having a sharp edge that partially protrudes into said slot from one of said sides.

14. The apparatus of claim 13 wherein measuring indicia are provided on said handle for measuring a wire.

15. The apparatus of claim 13 wherein a hole is provided on said handle for bending a wire.

16. The apparatus of claim 13 wherein said indicator is selected from the group consisting of a lighted signal, an audio signal, a liquid crystal display, a meter, and combinations thereof.

* * * * *

UNITED STATES PATENT AND TRADEMARK OFFICE
CERTIFICATE OF CORRECTION

| | | |
|---|---|---|
| PATENT NO. | : 7,302,753 B2 | Page 1 of 2 |
| APPLICATION NO. | : 10/961358 | |
| DATED | : December 4, 2007 | |
| INVENTOR(S) | : Bryan Cahill and Deborah Unser | |

It is certified that error appears in the above-identified patent and that said Letters Patent is hereby corrected as shown below:

Column 7, Line 66: Replace:

"1. An apparatus for manipulating an electrical wall socket fixture comprising an insulated handle having two sets of conductive prongs thereon for temporary engagement with a pair of sockets of said fixture, a pair of indicators on said handle, and wiring inside said handle connecting each set of prongs to one of said indicators such that each said indicator is triggered by the proper completion of a circuit through one of said sets of prongs and wherein a hole is provided on said handle that is to be bent and the handle includes an integrated electrical wire stripper available and sized to accommodate receipt of an electrical wire."

with

--1. An apparatus for manipulating an electrical wall socket fixture comprising an insulated handle having two sets of conductive prongs thereon for temporary engagement with a pair of sockets of said fixture, a pair of indicators on said handle, and wiring inside said handle connecting each set of prongs to one of said indicators such that each said indicator is triggered by the proper completion of a circuit through one of said sets of prongs and wherein a hole is provided on said handle that is available and sized to accommodate receipt of an electrical wire to be bent and the handle includes an integrated electrical wire clipper.--

Column 8, Line 21: Replace:

"5. The apparatus of claim 1 wherein said integrated electrical wire stripper comprising a slot provided at an edge of said handle, said slot having a floor and two opposing sides, and a blade having a sharp edge that partially protrudes into said slot from one of said sides."

with

UNITED STATES PATENT AND TRADEMARK OFFICE
CERTIFICATE OF CORRECTION

PATENT NO. : 7,302,753 B2  
APPLICATION NO. : 10/961358  
DATED : December 4, 2007  
INVENTOR(S) : Bryan Cahill and Deborah Unser It is certified that error appears in the above-identified patent and that said Letters Patent is hereby corrected as shown below:

--5. The apparatus of claim 1 wherein said integrated electrical wire stripper comprises a slot provided at an edge of said handle, said slot having a floor and two opposing sides, and a blade having a sharp edge that partially protrudes into said slot from one of said sides.--

Signed and Sealed this

Thirteenth Day of May, 2008

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,302,753 B2 | |
| APPLICATION NO. | : 10/961358 | |
| DATED | : December 4, 2007 | |
| INVENTOR(S) | : Bryan Cahill and Deborah Unser | |

It is certified that error appears in the above-identified patent and that said Letters Patent is hereby corrected as shown below:

Column 7, Line 66: Should read:

--1. An apparatus for manipulating an electrical wall socket fixture comprising an insulated handle having two sets of conductive prongs thereon for temporary engagement with a pair of sockets of said fixture, a pair of indicators on said handle, and wiring inside said handle connecting each set of prongs to one of said indicators such that each said indicator is triggered by the proper completion of a circuit through one of said sets of prongs and wherein a hole is provided on said handle that is available and sized to accommodate receipt of an electrical wire to be bent and the handle includes an integrated electrical wire stripper.--

Column 8, Line 21: Replace:

"5. The apparatus of claim 1 wherein said integrated electrical wire stripper comprising a slot provided at an edge of said handle, said slot having a floor and two opposing sides, and a blade having a sharp edge that partially protrudes into said slot from one of said sides."

with

--5. The apparatus of claim 1 wherein said integrated electrical wire stripper comprises a slot provided at an edge of said handle, said slot having a floor and two opposing sides, and a blade having a sharp edge that partially protrudes into said slot from one of said sides.--

UNITED STATES PATENT AND TRADEMARK OFFICE
CERTIFICATE OF CORRECTION

| | |
|---|---|
| PATENT NO. | : 7,302,753 B2 |
| APPLICATION NO. | : 10/961358 |
| DATED | : December 4, 2007 |
| INVENTOR(S) | : Bryan Cahill and Deborah Unser |

It is certified that error appears in the above-identified patent and that said Letters Patent is hereby corrected as shown below:

Column 9, Line 5: Replace:

"12. An apparatus for manipulating an electrical wall socket fixture comprising an insulated handle having a plurality of conductive prongs thereon for temporary engagement with hot, neutral and ground slots of at least one socket of said fixture, a plurality of indicators on said handle, and wiring inside said handle connecting each of said prongs to an indicator such that each of said indicators is triggered, respectively, by proper completion of a circuit through said hot, neutral and ground slots of said socket; wherein said each of said indicators is selected from the group consisting of a lighted signal, an audio signal, a liquid crystal display, a meter, and combinations thereof; wherein a wire stripping slot is provided at an edge of said handle, said slot having a floor and two opposing sides, and a blade is provided adjacent to said slot such that a sharp edge of said blade partially protrudes into said slot from one of said sides for engagement with an insulated sleeve of a wire to be stripped; wherein measuring indicia are provided on one of said support arms for use in determining a length of wire to be stripped; and wherein a hole is provided on said handle for bending a wire for attachment to said fixture."

with:

--12. An apparatus for manipulating an electrical wall socket fixture comprising an insulated handle having a plurality of conductive prongs thereon for temporary engagement with hot, neutral and ground slots of at least one socket of said fixture, a plurality of indicators on said handle, and wiring inside said handle connecting each of said prongs to an indicator such that each of said indicators is triggered, respectively, by proper completion of a circuit through said hot, neutral and ground slots of said socket; wherein each of said indicators is selected from the group consisting of a lighted signal, an audio signal, a liquid crystal display, a meter, and combinations thereof; wherein a wire stripping slot is provided at an edge of said handle, said slot having a floor and two opposing sides, and a blade is provided adjacent to said slot such that a sharp edge of said blade partially protrudes into said slot from one of said sides for engagement with an insulated sleeve of a wire to be stripped; wherein measuring indicia are provided on said handle for use in determining a length of wire to be stripped; and wherein a hole is provided on said handle for bending a wire for attachment to said fixture.--

UNITED STATES PATENT AND TRADEMARK OFFICE
CERTIFICATE OF CORRECTION

PATENT NO. : 7,302,753 B2
APPLICATION NO. : 10/961358
DATED : December 4, 2007
INVENTOR(S) : Bryan Cahill and Deborah Unser It is certified that error appears in the above-identified patent and that said Letters Patent is hereby corrected as shown below:

Column 10, Line 3: Replace:

"13. An apparatus for manipulating an electrical wall socket fixture comprising an insulated handle having a plurality of conductive prongs thereon for temporary engagement with at least one socket of said fixture, an indicator on said handle, and wiring inside said handle connecting said prongs to said indicator such that said indicator is triggered by completion of a circuit through said prongs, wherein a wire stripping slot is provided on said handle, said slot having a floor and two opposing sides, and blade is provided having a sharp edge that partially protrudes into said slot from one of said sides."

with:

--13. An apparatus for manipulating an electrical wall socket fixture comprising an insulated handle having a plurality of conductive prongs thereon for temporary engagement with at least one socket of said fixture, an indicator on said handle, and wiring inside said handle connecting said prongs to said indicator such that said indicator is triggered by completion of a circuit through said prongs, wherein a wire stripping slot is provided on said handle, said slot having a floor and two opposing sides, and a blade is provided having a sharp edge that partially protrudes into said slot from one of said sides.--

This certificate supersedes the Certificate of Correction issued May 13, 2008.

Signed and Sealed this

First Day of December, 2009

David J. Kappos
*Director of the United States Patent and Trademark Office*